United States Patent
Fasano et al.

(10) Patent No.: US 11,502,106 B2
(45) Date of Patent: Nov. 15, 2022

(54) MULTI-LAYERED SUBSTRATES OF SEMICONDUCTOR DEVICES

(71) Applicant: GLOBALFOUNDRIES U.S. INC., Santa Clara, CA (US)

(72) Inventors: Benjamin Vito Fasano, New Windsor, NY (US); Koushik Ramachandran, Wappingers Falls, NY (US); Ian Douglas Walter Melville, Highland, NY (US); Sarah Huffsmith Knickerbocker, Hopewell Junction, NY (US); Jorge Lubguban, Danbury, CT (US)

(73) Assignee: GlobalFoundries U.S. Inc., Malta, NY (US)

( * ) Notice: Subject to any disclaimer, the term of this patent is extended or adjusted under 35 U.S.C. 154(b) by 0 days.

(21) Appl. No.: 16/788,276

(22) Filed: Feb. 11, 2020

(65) Prior Publication Data
US 2021/0249442 A1    Aug. 12, 2021

(51) Int. Cl.
H01L 29/78 (2006.01)
H01L 27/12 (2006.01)
H01L 29/06 (2006.01)
H01L 21/762 (2006.01)
H01L 29/161 (2006.01)

(52) U.S. Cl.
CPC .... H01L 27/1203 (2013.01); H01L 21/76251 (2013.01); H01L 29/0603 (2013.01); H01L 29/161 (2013.01)

(58) Field of Classification Search
CPC ........... H01L 27/1203; H01L 21/76251; H01L 29/0603; H01L 29/161
USPC ........................................................ 257/616
See application file for complete search history.

(56) References Cited

U.S. PATENT DOCUMENTS

| | | | |
|---|---|---|---|
| 6,362,082 B1 * | 3/2002 | Doyle | H01L 21/26506 438/523 |
| 7,911,012 B2 | 3/2011 | Leedy | |
| 8,242,025 B2 * | 8/2012 | Kawashima | H01L 21/8221 438/738 |
| 9,263,314 B2 | 2/2016 | Puligadda et al. | |
| 2002/0086472 A1 * | 7/2002 | Roberds | H01L 29/7842 438/197 |
| 2003/0040158 A1 * | 2/2003 | Saitoh | H01L 21/823807 438/279 |
| 2003/0067035 A1 * | 4/2003 | Tews | H01L 29/42368 257/333 |
| 2003/0215989 A1 * | 11/2003 | Kim | H01L 29/66772 438/157 |
| 2003/0234439 A1 * | 12/2003 | Currie | H01L 29/0847 257/616 |
| 2004/0235262 A1 * | 11/2004 | Lee | H01L 29/78654 438/411 |

(Continued)

FOREIGN PATENT DOCUMENTS

CN    102110607 B  *  7/2012

OTHER PUBLICATIONS

CN-102110607-B English translation added.*

*Primary Examiner* — Sheikh Maruf
(74) *Attorney, Agent, or Firm* — Anthony Canale

(57) ABSTRACT

A semiconductor device is provided, which includes a multi-layered substrate having an interposed polymeric film and a device layer arranged over the multi-layered substrate.

20 Claims, 7 Drawing Sheets

(56) References Cited

U.S. PATENT DOCUMENTS

| | | | |
|---|---|---|---|
| 2004/0235264 A1* | 11/2004 | Forbes | H01L 29/66742 438/429 |
| 2005/0037603 A1* | 2/2005 | Coronel | H01L 29/42384 438/619 |
| 2005/0093076 A1* | 5/2005 | Steegen | H01L 21/823814 257/369 |
| 2005/0106790 A1* | 5/2005 | Cheng | H01L 29/1054 438/172 |
| 2006/0194421 A1* | 8/2006 | Ieong | H01L 27/1203 438/510 |
| 2008/0160727 A1* | 7/2008 | Yeo | H01L 21/84 438/481 |
| 2009/0224369 A1* | 9/2009 | Gamble | H01L 29/78603 257/616 |
| 2010/0200897 A1* | 8/2010 | Heringa | H01L 29/0847 257/288 |
| 2014/0131898 A1* | 5/2014 | Shearer | H01L 24/83 257/783 |
| 2014/0159194 A1* | 6/2014 | Song | H01L 29/0649 257/522 |
| 2014/0252555 A1* | 9/2014 | Ikeda | H01L 21/76251 438/459 |
| 2016/0087069 A1* | 3/2016 | Oda | H01L 29/0649 257/77 |
| 2016/0307806 A1* | 10/2016 | Chou | H01L 21/84 |
| 2017/0047419 A1* | 2/2017 | Glass | H01L 29/0847 |
| 2017/0062474 A1* | 3/2017 | Lee | H01L 27/0207 |
| 2017/0117296 A1* | 4/2017 | Chhun | H01L 21/02529 |
| 2017/0125287 A1* | 5/2017 | Zhu | H01L 21/76254 |
| 2017/0125303 A1* | 5/2017 | Cheng | H01L 21/2254 |
| 2017/0170178 A1* | 6/2017 | Cheng | H01L 27/092 |
| 2017/0179238 A1* | 6/2017 | Cheng | H01L 29/1608 |
| 2017/0186854 A1* | 6/2017 | Cheng | H01L 21/28518 |
| 2017/0221774 A1* | 8/2017 | Cheng | H01L 21/3081 |
| 2017/0229347 A1* | 8/2017 | Cheng | H01L 21/02428 |
| 2017/0229352 A1* | 8/2017 | Czornomaz | H01L 29/4966 |
| 2017/0256565 A1* | 9/2017 | Nummy | H01L 21/84 |
| 2017/0316979 A1* | 11/2017 | Ando | H01L 21/823807 |
| 2020/0006069 A1* | 1/2020 | Dewey | H01L 29/66469 |
| 2020/0321466 A1* | 10/2020 | Cortes | H01L 29/66772 |

* cited by examiner

MULTI-LAYERED SUBSTRATES OF SEMICONDUCTOR DEVICES

FIELD OF THE INVENTION

The disclosed subject matter relates generally to substrates of semiconductor devices, and more particularly to multi-layered substrates of semiconductor devices and methods of forming the same.

BACKGROUND

There is an increasing demand for radio frequency (RF) semiconductor devices, such as for use in wireless devices for the telecommunication industry, in driverless vehicles for automotive industry and in radar systems for aviation, space and defense industries. RF semiconductor devices are able to provide reliable and high-speed connectivity.

RF semiconductor devices are required to handle high to extremely high-frequency switching speed of high-powered RF signals. The presence of parasitic components, such as parasitic capacitance, inductance, and resistance, may combine to attenuate and degrade the performance of RF semiconductor devices. It is critical to ensure the parasitic components are kept low, or at least at an acceptable level, for a specific application.

One of the possible solutions to reducing parasitic capacitance, as well as substrate current leakage, is to fabricate RF semiconductor devices on a semiconductor-on-insulator substrate (SOI), such as a silicon-on-insulator substrate. The SOI substrate, having an electrically resistive insulator layer arranged between a thin semiconductor layer and a bulk semiconductor substrate, is able to lower parasitic capacitance of the RF semiconductor devices fabricated thereon. The RF semiconductor devices fabricated on an SOI substrate may achieve an improved device performance compared to that of RF semiconductor devices fabricated on a bulk silicon substrate.

However, the cost of SOI substrates is much higher than that of bulk semiconductor substrates. Therefore, lower cost methods to manufacture high-performance semiconductor devices are desired.

SUMMARY

To achieve the foregoing and other aspects of the present disclosure, multi-layered substrates and methods of forming the same are presented.

According to an aspect of the present disclosure, a semiconductor device is provided, which includes a multi-layered substrate having an interposed polymeric film and a device layer arranged over the multi-layered substrate.

According to another aspect of the present disclosure, a semiconductor device is provided, which includes a multi-layered substrate and a device layer arranged over the multi-layered substrate. The multi-layered substrate includes a support substrate, a semiconductor layer, and a polymeric film interposed between the support substrate and the semiconductor layer.

According to yet another aspect of the present disclosure, a method of forming a semiconductor device wafer is provided, which includes providing a handle wafer comprising a semiconductor layer and a device layer arranged over the semiconductor layer and providing a support substrate. A polymeric film is arranged over the support substrate and the support substrate is attached to the handle wafer such that the semiconductor layer, the polymeric film, and the support substrate form a multi-layered substrate for the semiconductor device wafer.

BRIEF DESCRIPTION OF THE DRAWINGS

The embodiments of the present disclosure will be better understood from a reading of the following detailed description, taken in conjunction with the accompanying drawings.

Figure 1A:
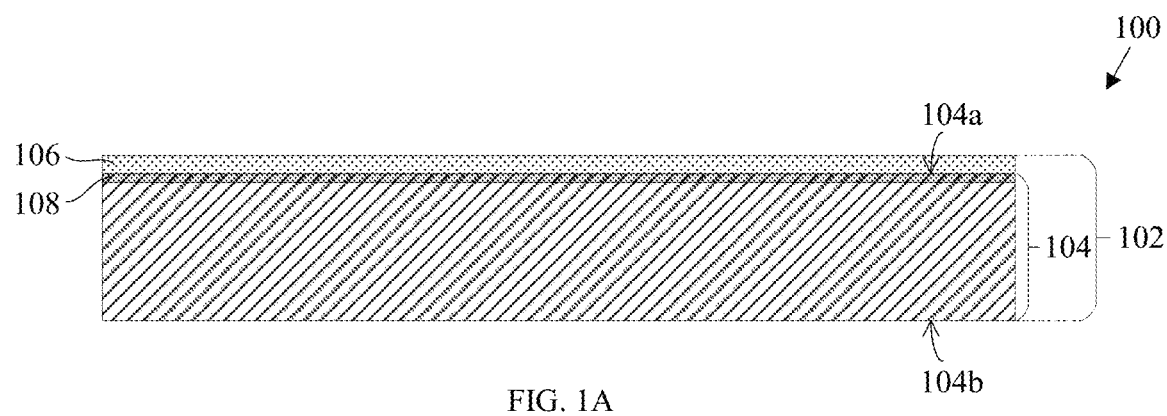
FIG. 1A to FIG. 1I(b) are cross-sectional views of a partially processed semiconductor device wafer 100, illustrating various stages of forming multi-layered substrates, according to embodiments of the disclosure.

For simplicity and clarity of illustration, the drawings illustrate the general manner of construction, and certain descriptions and details of well-known features and techniques may be omitted to avoid unnecessarily obscuring the discussion of the described embodiments of the device. Additionally, elements in the drawings are not necessarily drawn to scale. For example, the dimensions of some of the elements in the drawings may be exaggerated relative to other elements to help improve understanding of embodiments of the device. The same reference numerals in different drawings denote the same elements, while similar reference numerals may, but do not necessarily, denote similar elements.

DETAILED DESCRIPTION

The present disclosure relates to substrates of semiconductor devices, and more particularly to multi-layered substrates and methods of forming the same. Various embodiments of the present disclosure are now described in detail with accompanying drawings. It is noted that like and corresponding elements are referred to by the use of the same reference numerals. The embodiments disclosed herein are exemplary, and not intended to be exhaustive or limiting to the disclosure.

FIG. 1A to FIG. 1I(b) are cross-sectional views of a partially processed semiconductor device wafer 100, illustrating various stages of forming multi-layered substrates, according to embodiments of the disclosure. Certain structures may be conventionally fabricated, for example, using known processes and techniques, and specifically disclosed processes and methods may be used to achieve individual aspects of the present disclosure.

As illustrated in FIG. 1A, the semiconductor device wafer 100 may include a handle wafer 102. The handle wafer 102 may include a semiconductor substrate 104 and a device layer 106 arranged over the semiconductor substrate 104. The semiconductor substrate 104 may include a front or device surface 104a and a back surface 104b. The semiconductor substrate 104 may include a bulk semiconductor material such as, but not limited to, silicon, germanium, silicon carbide, other II-VI or III-V semiconductor compounds, or combinations thereof.

The device layer 106 may be arranged over the front surface of the semiconductor substrate 104a. The device layer 106 may include a plurality of semiconductor dies having a plurality of microelectronic devices such as, but not limited to, integrated circuits (for example, transistors, capacitors, etc.) or microelectromechanical systems (MEMS). The microelectronic devices may be fabricated on or from the semiconductor substrate 104 and may be formed using known semiconductor processes. For simplicity, the plurality of semiconductor dies and the plurality of microelectronic devices are not shown in the accompanying drawings. The microelectronic devices in the device layer may have completed their processing steps at their respective integrated device manufacturers or foundries. The device layer 106 may further include a passivation layer (not shown) arranged over the device layer 106 that serves to protect the device layer 106 from external contamination and environmental effects.

In some embodiments of the disclosure, the semiconductor substrate 104 may further include a thin semiconductor layer 108 arranged at an upper portion of the semiconductor substrate 104. The thin semiconductor layer 108 may extend across the entire front surface of the semiconductor substrate 104a and may be arranged under the device layer 106. The thin semiconductor layer 108 may be formed using known semiconductor processes such as, but not limited to, a diffusion process, an implantation process, or an epitaxial process. The thin semiconductor layer 108 may include a semiconductor material such as, but not limited to, epitaxially-grown silicon germanium.

In some embodiments of the disclosure, the thin semiconductor layer 108 may be formed of a semiconductor material that is compatible with semiconductor processes, for example, the thin semiconductor layer 108 may be compatible with epitaxial processes that structures of microelectronic devices, such as source and drain regions of transistor devices, may be formed therein.

In some embodiments of the disclosure, the thin semiconductor layer 108 may have a substantially high etch selectivity to the semiconductor substrate 104, and may serve as an etch stop layer.

The term "etch selectivity" as used herein refers to the material removal rate of one material relative to the material removal rate of another material, for example, the ratio of material removal rate of the semiconductor substrate 104 to the material removal rate of the thin semiconductor layer 108.

The term "substantially high etch selectivity" as used herein refers to a characteristic between two materials, such that one material may be removed without substantially removing the other material. For example, the etch selectivity between the semiconductor substrate 104 and the thin semiconductor layer 108 may be in a ratio of 10:1, such that for every 10 Å of the material removed from the semiconductor substrate 104, only 1 Å of the material of the thin semiconductor layer 108 is removed. Therefore the thin semiconductor layer 108 may serve as an etch stop layer such that during a material removal process of removing the semiconductor substrate 104, the thin semiconductor layer 108 may be removed at a much slower rate or remain substantially intact during the material removal process.

Figure 1B:
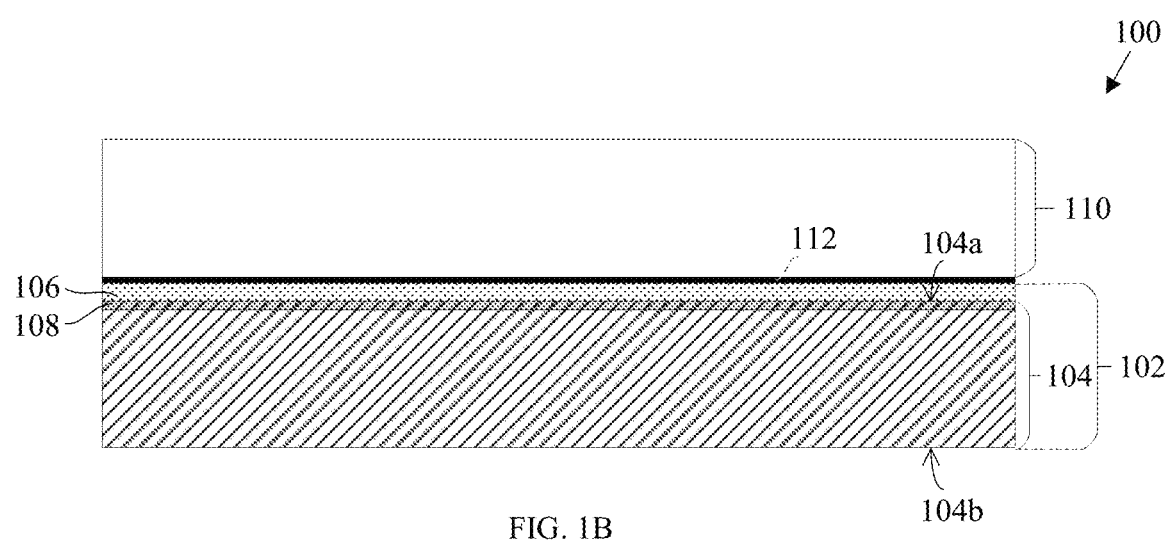

A carrier wafer 110 may be attached to the handle wafer 102 as illustrated in FIG. 1B, according to an embodiment of the disclosure. The carrier wafer 110 may include an adhesive layer 112 arranged over a surface of the carrier wafer 110. The carrier wafer 110 may be adhered to the handle wafer 102 by arranging the surface having the adhesive layer 112 to be in contact with the device layer 106 of the handle wafer 102. The carrier wafer 110 may provide a means for safe handling and/or processing of the handle wafer 102. The adhesive layer 112 may exhibit a relatively high bonding strength to the handle wafer 102 and to the carrier wafer 110 and enables the handle wafer 102 to be temporarily but securely attached to the carrier wafer 110.

In some embodiments of the disclosure, the carrier wafer 110 may include, but not limited to, a semiconductor wafer or layer of glass. The carrier wafer 110 may be of any shape, although the carrier wafer 110 may generally have a shape and size to match the handle wafer 102 so that the bonded assembly of the carrier wafer 110 and the handle wafer 102 may be handled in conventional processing tools and cassettes. In some embodiments of the disclosure, the adhesive layer 112 may include, but not limited to, low-temperature waxes, hydrocarbon oligomers, polymers, or epoxy-modified films.

Figure 1C:
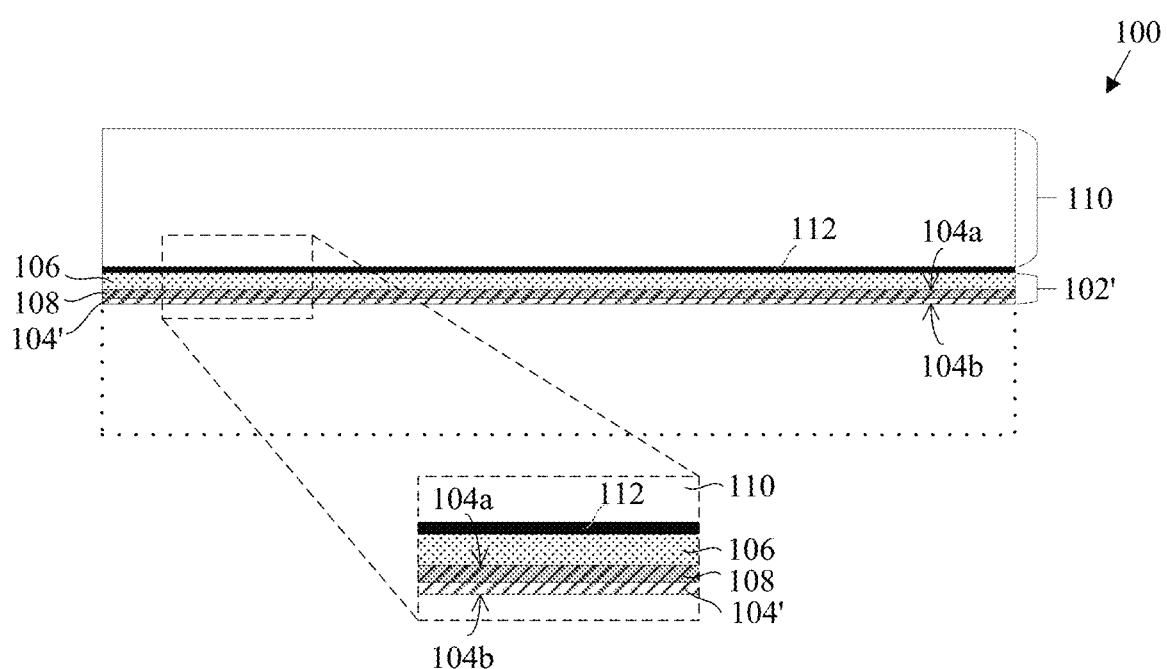

The semiconductor substrate 104 may have its thickness thinned down as illustrated in FIG. 1C, according to an embodiment of the disclosure. A suitable material removal process, such as a mechanical grinding process, also commonly known as a backgrinding process, or a selective etch process such as reactive ion etching process may be employed to thin down the semiconductor substrate 104 from the back substrate surface 104b to form a thinned handle wafer 102'. The portion of the semiconductor substrate 104 removed is demarcated by a dotted outline. A polishing step may be performed after the material removal process to improve the surface roughness of the thinned semiconductor substrate 104'.

In some embodiments of the disclosure, the thinned semiconductor substrate 104' may have a thickness in a range of 5 µm to 10 µm. The thinned handle wafer 102' may be fragile and the carrier wafer 110 may provide a means to support the full dimension of the thinned handle wafer 102' to prevent cracking or breakage.

Figure 1D:
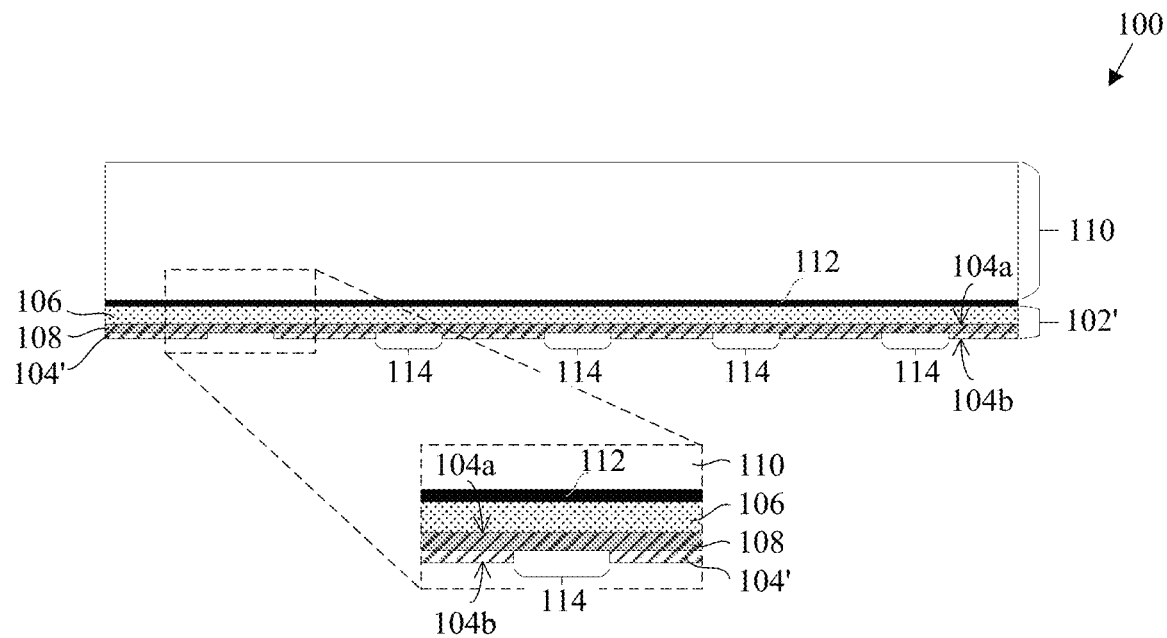
Figure 1D:
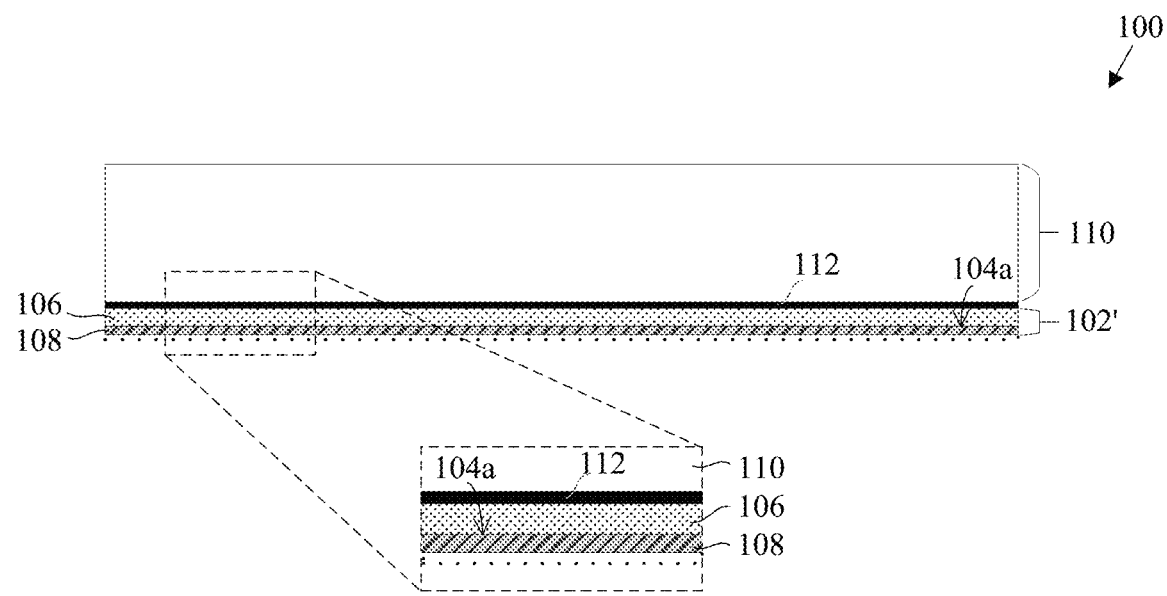

A plurality of cavities 114 may be formed in the thinned handle wafer 102' as illustrated in FIG. 1D(a), according to an embodiment of the disclosure. Portions of the thinned semiconductor substrate 104' may be removed to form the plurality of cavities 114. Portions of the thin semiconductor layer 108 may be exposed in the plurality of cavities 114. The plurality of cavities 114 may be arranged over selective areas of the device layer 106, for example, areas of the device layer 106 having RF semiconductor devices fabricated therein.

The plurality of the cavities 114 may be formed by an exemplary process described herein. A patterning layer (not shown) may be deposited over the back surface 104b of thinned semiconductor substrate 104' and portions of the thinned semiconductor substrate 104' may be exposed using a lithographic process. The exposed portions of the thinned semiconductor substrate 104' may be subsequently removed using a material removal process, such as a reactive-ion etching (RIE) process to form the plurality of cavities 114.

In some embodiments of the disclosure, the thinned semiconductor substrate 104' may be entirely removed as illustrated in FIG. 1D(b). The removed thinned semiconductor substrate 104' is demarcated by a dotted outline. The thin semiconductor layer 108 of the thinned handle wafer 102' is exposed after the removal of the thinned semiconductor substrate 104'.

Due to the substantially high etch selectivity between the materials of the semiconductor substrate 104 and the thin semiconductor layer 108, the thin semiconductor layer 108 may remain substantially unaffected by the material removal process and may adequately protect the device layer 106 during the material removal process.

Figure 1E:
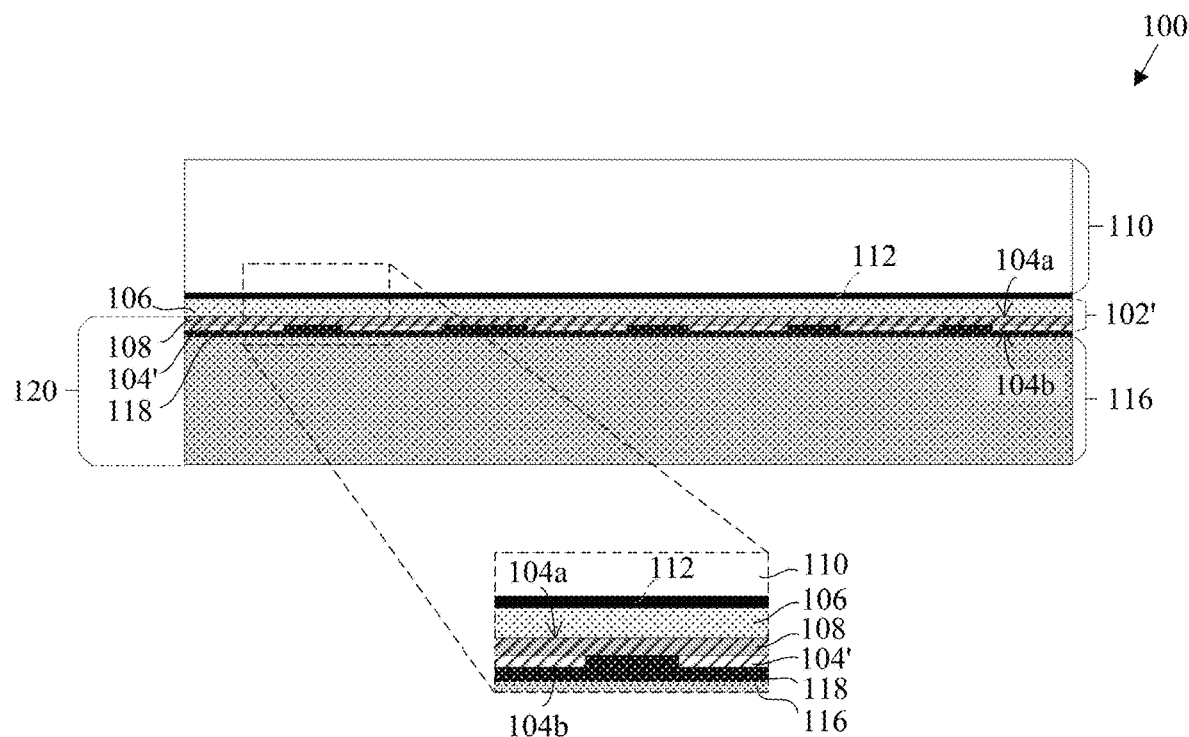
Figure 1E:
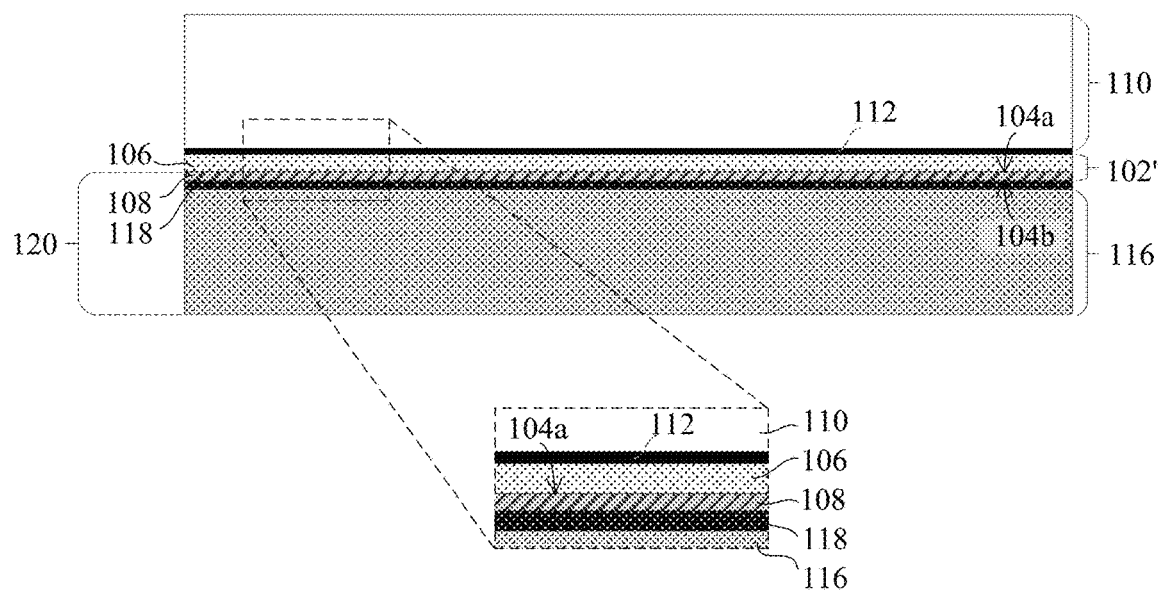

A support substrate 116 may be attached to the thinned handle wafer 102' as illustrated in FIGS. 1E(a) and 1E(b), according to embodiments of the disclosure. FIG. 1E(a) continues from the embodiment shown in FIG. 1D(a), and FIG. 1E(b) continues from the embodiment shown in FIG. 1D(b). The support substrate 116 may include a polymeric film 118 arranged over a surface of the support wafer 116. The polymeric film 118 may be formed of adhesive material and may serve to adhere the support substrate 116 to the thinned handle wafer 102'. The polymeric film 118 may be in a form of a discrete film laminated over the entire surface of the support substrate 116 prior to the attachment process.

In some embodiments of the disclosure, the support substrate 116 may be attached to the thinned handle wafer 102' by arranging the surface having the polymeric film 118 to be in contact with the thinned semiconductor substrate 104', thereby adhering the support substrate 116 to the thinned handle wafer 102', as illustrated in FIG. 1E(a).

In some embodiments of the disclosure, the support substrate 116 may be attached to the thinned handle wafer 102' by arranging the surface having the polymeric film 118 to be in contact with the thin semiconductor layer 108, thereby adhering the support substrate 116 to the thinned handle wafer 102', as illustrated in FIG. 1E(b).

The support substrate 116 may be of any shape, although the support substrate 116 may generally have a shape and size to match the thinned handle wafer 102' so that the bonded assembly of the support substrate 116 and the thinned handle wafer 102' may be handled in conventional processing tools and cassettes. The support substrate 116 may provide a means to support the full dimension of the thinned handle wafer 102' to prevent cracking or breakage, and also for safe handling of the thinned handle wafer 102' after subsequent removal of the carrier wafer 110. A curing process may be employed to bake the polymeric film 118 to improve the integrity of the polymeric film 118 after the attachment process.

In some embodiments of the disclosure, the support substrate 116 may include a thermally conductive substrate such as, but not limited to, a bulk silicon wafer or a sapphire wafer. The support substrate 116 may serve as a heat spreading and heat sinking structure to dissipate heat from the semiconductor device wafer 100 when heat tends to be generated, for example, during electrical testing stages of the semiconductor device wafer 100 and during the subsequent operation of the semiconductor dies extracted from the semiconductor device wafer 100.

In some embodiments of the disclosure, the support substrate 116 may include a new wafer or a reclaimed wafer. The term "reclaimed wafer" as used herein refers to a processed semiconductor wafer that has been reprocessed for different uses. Using reclaimed wafers as support substrates provide secondary uses for the reclaimed wafers that may otherwise be disposed of Additionally, the cost of using reclaimed wafers is lower than that of using new wafers. Reclaimed wafers, similar to the new wafers, have a relatively high thermal conductivity that may dissipate heat efficiently.

In some embodiments of the disclosure, the polymeric film 118 may be a flowable polymeric film such that when the support substrate 116 is attached to the thinned handle wafer 102', the polymeric film 118 may flow and fill the plurality of cavities 114 under sufficient pressure and temperature during the attachment process, as illustrated in FIG. 1E(a).

In some embodiments of the disclosure, the polymeric film 118 may include a commercially available die-attach film (DAF). The DAFs are thermally conductive and electrically insulative polymeric films that are generally used for the purpose of allowing stacking of semiconductor wafers/dies on semiconductor wafers/dies or substrates during the assembly process of fabricating a multi-chip-module. The DAFs may include a polymeric binder and at least one thermally conductive and electrically insulative inorganic filler such as, but not limited to, diamond, aluminum oxide, aluminum nitride, boron nitride, silicon carbide, beryllium oxide, graphite, or other thermally conductive and electrically insulative materials known to those skilled in the art.

Because the DAFs are electrically insulative films, the DAFs do not interfere with electrical interconnections, and accordingly, the DAF may serve an electrically insulative layer that is substantially similar to the insulator layer in a commercially available semiconductor-on-insulator (SOI) substrate.

Additionally, the DAFs are substantially thermally stable films that may be able to withstand a wide range of semiconductor processing temperatures without disintegrating, decomposing or softening excessively. As solvents present in the die-attach material may be removed during the manufacturing stage of the DAFs, potential further outgassing from the DAFs may be minimized. Outgassing may lead to detrimental peeling of the DAFs due to reduced adhesion during the wafer testing stages where high temperatures tend to be applied. Also, the DAFs are substantially chemically stable films that are resistant to chemicals typically used in plating baths to form interconnect features such as pads, solder bumps and pillars.

In some embodiments of the disclosure, the polymeric film 118 attached to the support substrate 116 may have a thickness in a range of 5 μm to 20 μm. Thinner polymeric films may pose challenges in handling and laminating over the support wafer 116, and thicker polymeric films may be more efficient in relieving stress between layers having disparate thermal expansion coefficients. Thinner polymeric films may also transfer heat more quickly from devices, allowing heat to dissipate from the thinned handle wafer 102' where heat tends to be generated, for example, during electrical testing stages of the semiconductor device wafer 100 and during the subsequent operation of the semiconductor dies extracted from the semiconductor device wafer 100. In some embodiments of the disclosure, polymeric film 118 may have a preferred thickness of 10 μm to 20 μm.

The thin semiconductor layer 108, the polymeric film 118 and the support substrate 116 form a multi-layered substrate 120 for the semiconductor device wafer 100, upon which the device layer 106 may be arranged over. The multi-layered substrate 120 may have a configuration of a semiconductor-insulator-substrate stack, such that the polymeric film 118 is interposed between two thermally conductive layers, i.e., the thin semiconductor layer 108 and the support substrate 116, which may be similar to a commercially available SOI substrate.

Additionally, due to material similarity between the support substrate 116 and the thin semiconductor layer 108, both materials may have substantially similar thermal expansion coefficients such that potential stresses resulting from the different thermal expansions of the support substrate 116 and the thin semiconductor layer 108 may be kept low.

Figure 1F:
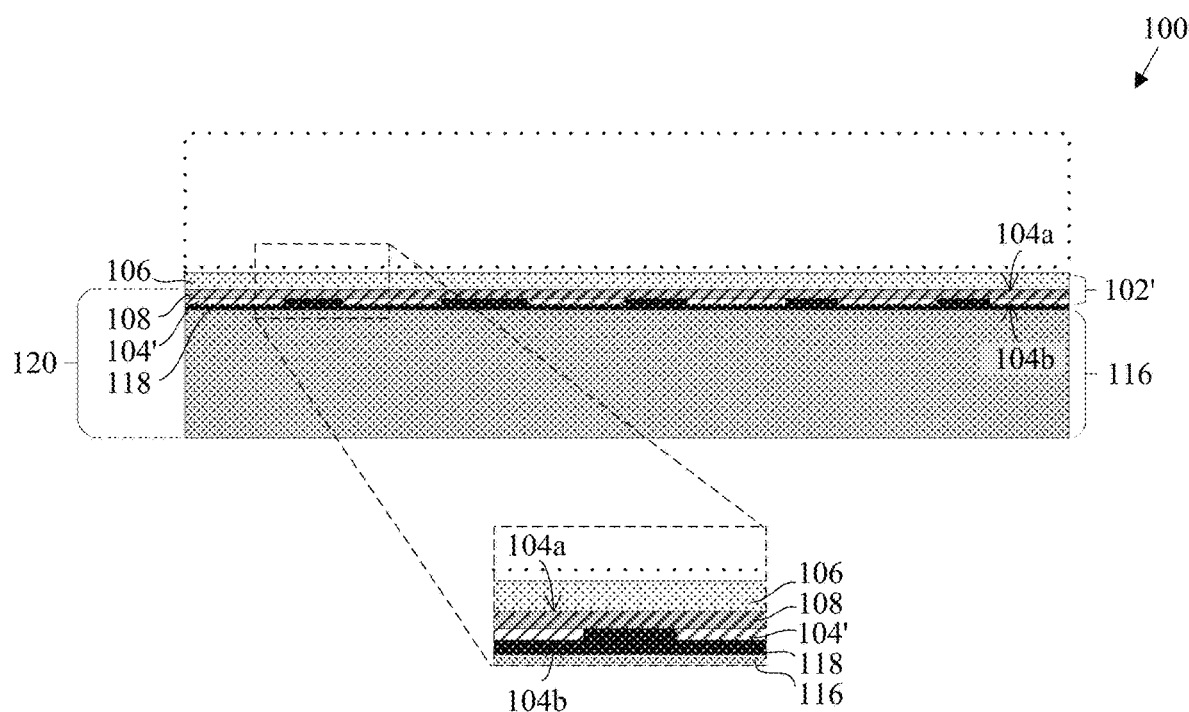
Figure 1F:
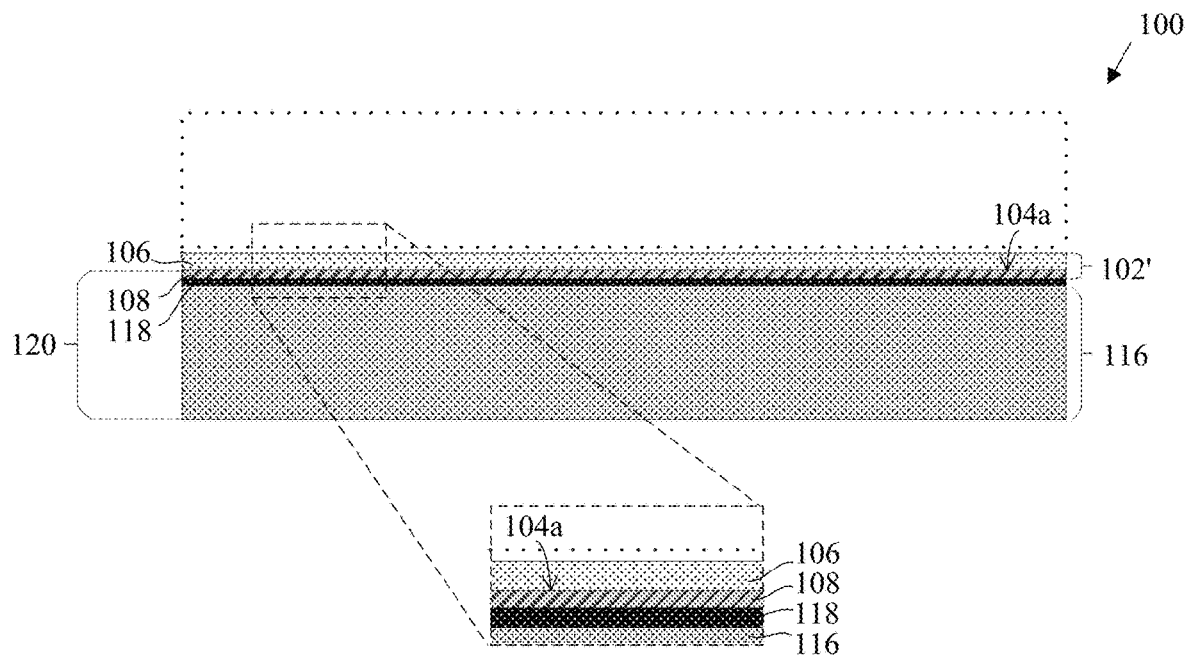

The carrier wafer 110 may be removed from the semiconductor device wafer 100 as illustrated in FIGS. 1F(a) and 1F(b), according to embodiments of the disclosure. FIG. 1F(a) continues from the embodiment shown in FIG. 1E(a), and FIG. 1F(b) continues from the embodiment shown in FIG. 1E(b). The carrier wafer 110, along with the adhesive layer 112, may be detached from the semiconductor device wafer 100 using a suitable debonding process such as, but not limited to, a slide debonding process, a laser debonding process or a mechanical debonding process. The device layer 106 of the thinned handle wafer 102' may be exposed after the debonding process. The support substrate 116 may provide a means for safe handling of the thinned handle wafer 102' after the detachment of the carrier wafer 110. The detached carrier wafer 110 and the removed adhesive layer 112 are demarcated by dotted outlines.

In some embodiments of the disclosure, the debonding process may leave traces of the adhesive layer 112 on the device layer 106 after detachment of the carrier wafer 110. The semiconductor device wafer 100 may undergo a cleaning process using cleaning agents such as, but not limited to, solvents capable of dissolving the adhesive layer 112 to remove any traces of the adhesive layer 112 on the device layer 106. A subsequent plasma cleaning process, for example, an oxygen ashing process, may be performed as well.

Figure 1G:
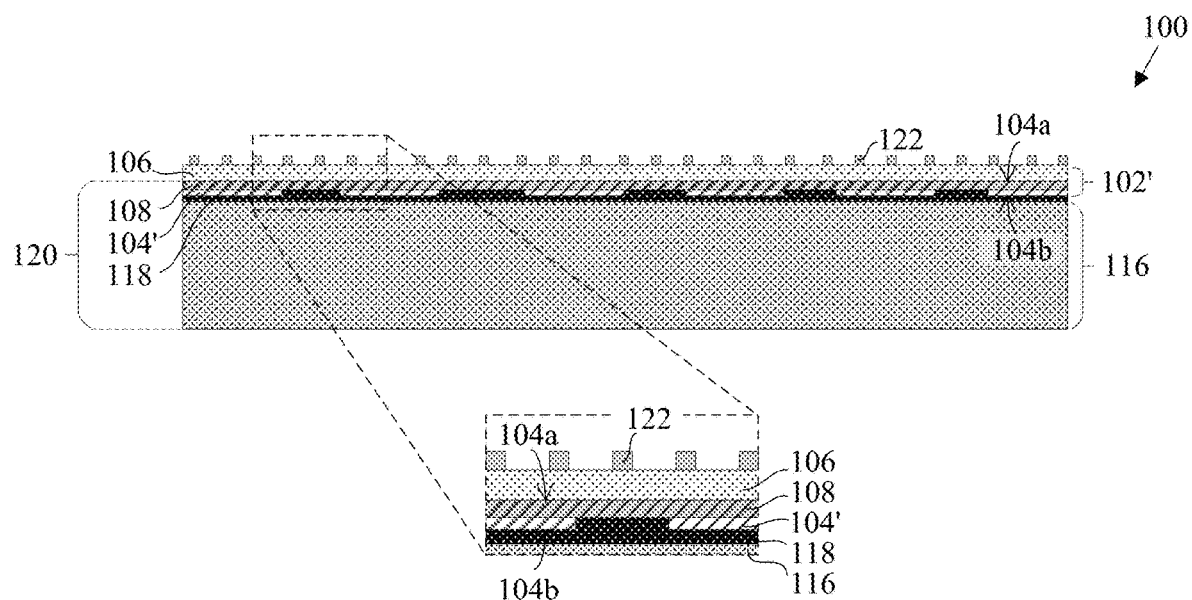
Figure 1G:
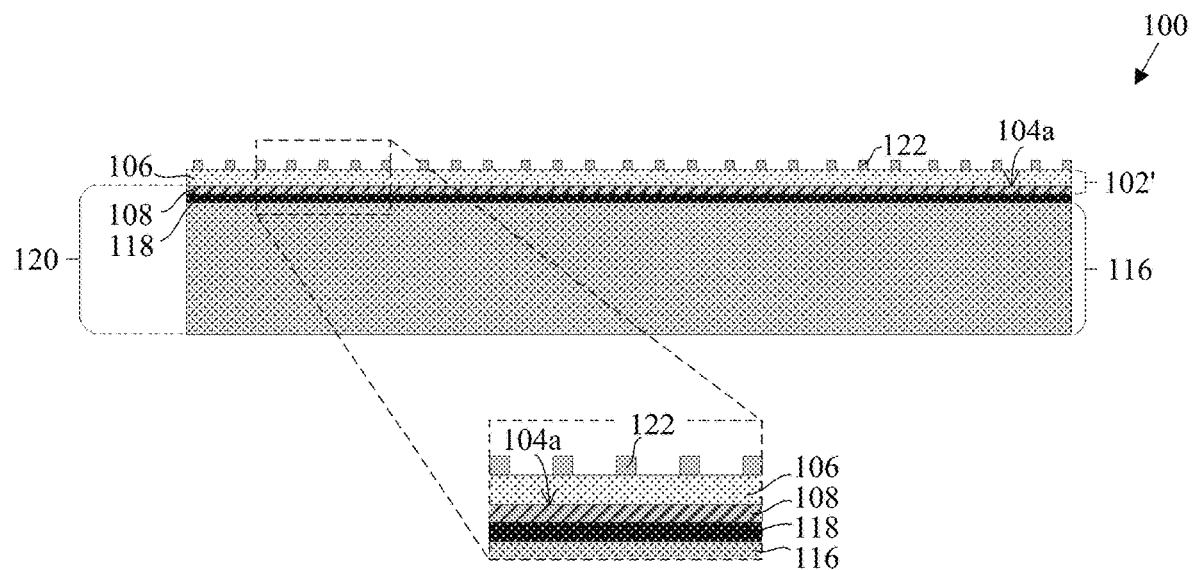

A plurality of conductive structures 122 may be arranged over the device layer 106 as illustrated in FIGS. 1G(a) and 1G(b), according to embodiments of the disclosure. FIG. 1G(a) continues from the embodiment shown in FIG. 1F(a), and FIG. 1G(b) continues from the embodiment shown in FIG. 1F(b). The plurality of conductive structures 122 may be arranged over the device layer 106 of the thinned handle wafer 102'. The plurality of conductive structures 122 may provide a means for electrical connection between the semiconductor device wafer 100 and external packaging components, such as a printed circuit board connected through wire-bonding or flip-chip bonding.

In some embodiments of the disclosure, the plurality of conductive structures 122 may be formed by an outsourced semiconductor assembly and test (OSAT) provider.

In some embodiments of the disclosure, the plurality of conductive structures 122 may serve as probing structures for electrical tests during wafer testing stages. The electrical tests may identify non-functional dies from functional dies, and thereby avoid assembly of those non-functional dies into packages. Such electrical tests may be performed under relatively high temperatures, and the multi-layered substrate 120 may dissipate heat away efficiently through the thermally conductive layers of the thin semiconductor layer 108, the polymeric film 118 and the support substrate 116 during those electrical tests.

Figure 1H:
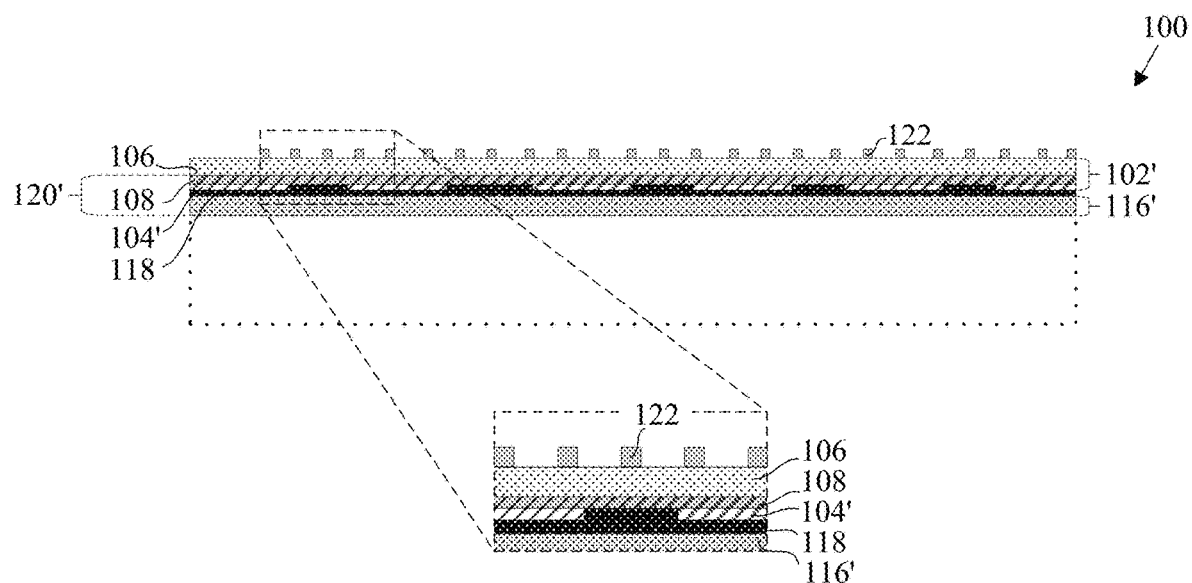
Figure 1H:
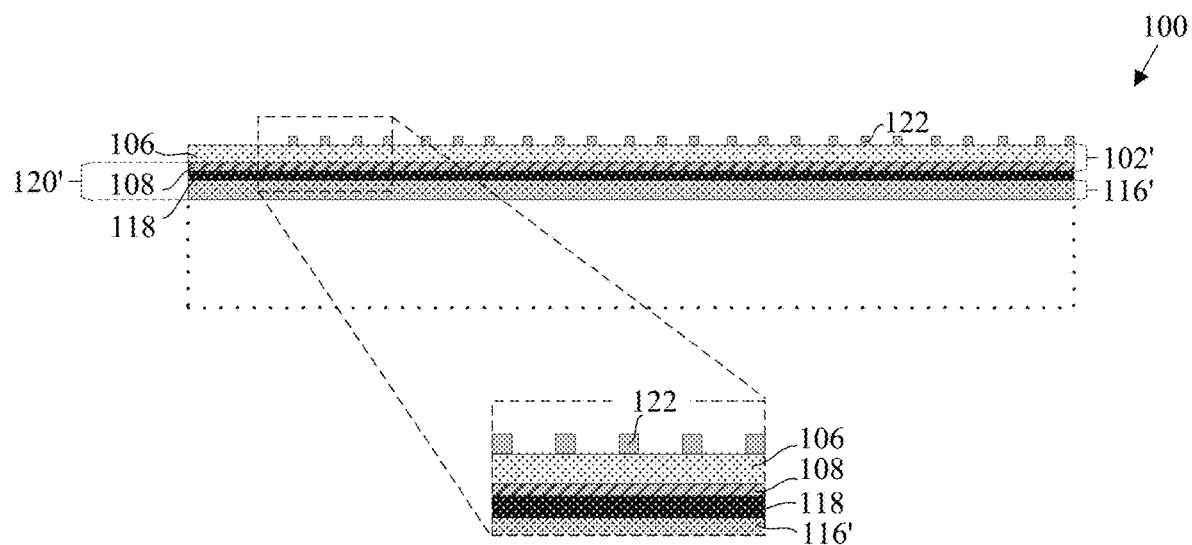

Semiconductor dies are continuously driven to be smaller and thinner, and the multi-layered substrate 120 may have its thickness thinned down as illustrated in FIGS. 1H(a) and 1H(b), according to embodiments of the disclosure. FIG. 1H(a) continues from the embodiment shown in FIG. 1G(a), and FIG. 1H(b) continues from the embodiment shown in FIG. 1G(b). The multi-layered substrate 120 may be thinned down by removing a portion of the support substrate 116, leaving a thinned portion of the support substrate 116' to form a thinned multi-layered substrate 120'. The portion of the support substrate 116 removed is demarcated by dotted outlines. The thinned multi-layered substrate 120' may further facilitate heat dissipation and allows a much smaller form factor of the semiconductor device wafer 100 to be achieved. A suitable material removal process, such as a backgrinding process, may be employed to thin down the multi-layered substrate 120. A polishing step may be performed after the material removal process to improve the surface roughness and increase the mechanical strength of the thinned multi-layered substrate 120'.

Figure 1I:
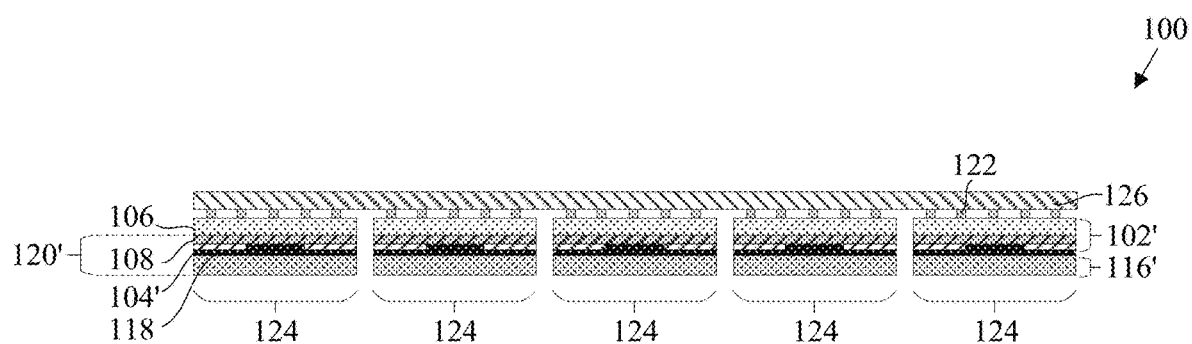
Figure 1I:
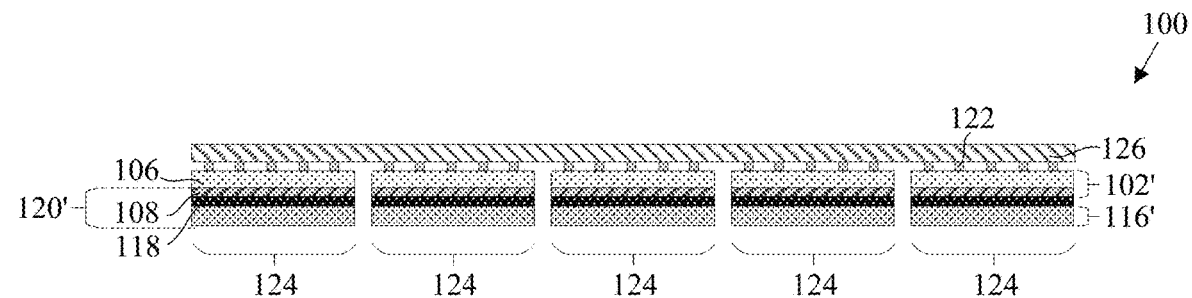

A plurality of semiconductor dies 124 may be extracted from the semiconductor device wafer 100 as illustrated in FIGS. 1I(a) and 1I(b), according to embodiments of the disclosure. FIG. 1I(a) continues from the embodiment shown in FIG. 1H(a), and FIG. 1I(b) continues from the embodiment shown in FIG. 1H(b). The plurality of semiconductor dies 124 may be placed on a dicing tape 126 for ease of handling. The semiconductor device wafer 100 or the plurality of semiconductor dies 124 may be further stacked onto semiconductor wafers and/or dies or connected to an external packaging component, such as a printed circuit board.

In some embodiments of the disclosure, the semiconductor device wafer 100 may be diced into a plurality of semiconductor dies 124 before thinning down the thickness of the support substrate 116 in FIGS. 1H(a) and 1H(b).

As presented in the above detailed description, multi-layered substrates of semiconductor devices and methods of forming the same are presented. A handle wafer may be provided, the handle wafer may include a semiconductor substrate and a device layer arranged over the semiconductor substrate. The semiconductor substrate of the handle wafer may be thinned down to form a thin semiconductor layer by means of using a carrier wafer. A support substrate having a polymeric film arranged over a surface of the support substrate may be arranged in contact with the thin semiconductor layer of the handle wafer. The polymeric film may be a thermally conductive and electrically insulative inorganic film that may be commercially available as a die-attach film (DAF). The thin semiconductor layer, the polymeric film, and the support wafer form a multi-layered substrate that is substantially similar to a commercially available SOI substrate, over which the device layer is arranged.

The cost of forming the multi-layered substrate may be lower than the cost of a commercially available SOI substrate, as the multi-layered substrate may use reclaimed wafers that may otherwise be disposed of.

The terms "top", "bottom", "over", "under", and the like in the description and in the claims, if any, are used for descriptive purposes and not necessarily for describing permanent relative positions. It is to be understood that the terms so used are interchangeable under appropriate circumstances such that the embodiments of the devices described herein are, for example, capable of operation in other orientations than those illustrated or otherwise described herein.

Additionally, the formation of a first feature over or on a second feature in the description that follows may include embodiments in which the first and second features are formed in direct contact, and may also include embodiments in which additional features may be formed interposing the first and second features, such that the first and second features may not be in direct contact.

Similarly, if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in an embodiment" herein do not necessarily all refer to the same embodiment.

In addition, unless otherwise indicated, all numbers expressing quantities, ratios, and numerical properties of materials, reaction conditions, and so forth used in the specification and claims are to be understood as being modified in all instances by the term "about".

While several exemplary embodiments have been presented in the above detailed description of the device, it should be appreciated that a number of variations exist. It should further be appreciated that the embodiments are only examples, and are not intended to limit the scope, applicability, dimensions, or configuration of the device in any way. Rather, the above detailed description will provide those skilled in the art with a convenient road map for implementing an exemplary embodiment of the device, it being understood that various changes may be made in the function and arrangement of elements and method of fabrication described in an exemplary embodiment without departing from the scope of this disclosure as set forth in the appended claims.

What is claimed is:

1. A semiconductor device comprising:
a multi-layered substrate, wherein the multi-layered substrate comprises an interposed film, the interposed film is an electrically insulative film including:
  a polymeric binder; and
  at least one inorganic filler; and
a device layer arranged over the multi-layered substrate.

2. The semiconductor device of claim 1, wherein the at least one inorganic filler is thermally conductive and electrically insulating.

3. The semiconductor device of claim 2, wherein the at least one inorganic filler comprises diamond, aluminum oxide, aluminum nitride, boron nitride, silicon carbide, beryllium oxide, or graphite.

4. The semiconductor device of claim 1, wherein the interposed film has a thickness ranging from 5 µm to 20 µm.

5. The semiconductor device of claim 1, wherein the multi-layered substrate further comprises:
a support substrate; and
a semiconductor layer, wherein the interposed film is arranged between the support substrate and the semiconductor layer.

6. The semiconductor device of claim 5, wherein the support substrate comprises a thermally conductive material.

7. The semiconductor device of claim 5, wherein the support substrate comprises silicon or sapphire.

8. The semiconductor device of claim 5, wherein the semiconductor layer comprises silicon or silicon germanium.

9. The semiconductor device of claim 5, wherein the semiconductor layer further comprises a first semiconductor material and a second semiconductor material arranged over the first semiconductor material.

10. A semiconductor device comprising:
a multi-layered substrate, comprising:
  a support substrate;
  a semiconductor layer; and
  an electrically insulative film interposed between the support substrate and the semiconductor layer, the electrically insulative film comprises:
    a polymeric binder; and
    at least one inorganic filler; and
a device layer arranged over the multi-layered substrate.

11. The semiconductor device of claim 10, wherein the electrically insulative film is laminated over the support substrate.

12. The semiconductor device of claim 10, wherein the semiconductor layer comprises a first semiconductor material and a second semiconductor material arranged over the first semiconductor material.

13. The semiconductor device of claim 12, wherein the first semiconductor material of the semiconductor layer comprises silicon.

14. The semiconductor device of claim 12, wherein the second semiconductor material of the semiconductor layer comprises silicon germanium.

15. A method of forming a semiconductor device wafer comprising:
arranging an electrically insulative film over a support substrate, the electrically insulative film comprises a polymeric binder and at least one inorganic filler; and
attaching the support substrate to a handle wafer, the handle wafer comprising a semiconductor layer and a device layer arranged over the semiconductor layer, wherein the semiconductor layer, the electrically insulative film, and the support substrate form a multi-layered substrate for the semiconductor device wafer.

16. The method of claim 15, wherein attaching the support substrate to the handle wafer further comprises adhering the electrically insulative film to the semiconductor layer.

17. The method of claim 15, wherein arranging the electrically insulative film over the support substrate further comprises laminating the electrically insulative film over an entire surface of the support substrate.

18. The method of claim 15, further comprises backgrinding the support substrate after attaching the support substrate to the handle wafer.

19. The method of claim 15, further comprises:
providing a semiconductor substrate as part of the handle wafer; and
backgrinding the semiconductor substrate to form the semiconductor layer before the support substrate is attached to the handle wafer.

20. The method of claim 15, further comprises:
providing a semiconductor substrate as part of the handle wafer; and
epitaxially growing the semiconductor layer over the semiconductor substrate.

* * * * *